United States Patent
Jeon

(10) Patent No.: US 9,741,402 B2
(45) Date of Patent: Aug. 22, 2017

(54) DATA STORAGE DEVICE AND OPERATING METHOD THEREOF

(71) Applicant: SK hynix Inc., Gyeonggi-do (KR)

(72) Inventor: Myeong Woon Jeon, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/060,724

(22) Filed: Mar. 4, 2016

(65) Prior Publication Data
US 2017/0140802 A1    May 18, 2017

(30) Foreign Application Priority Data

Nov. 18, 2015  (KR) .......................... 10-2015-0161811

(51) Int. Cl.
*G11C 7/12* (2006.01)
*G11C 7/14* (2006.01)

(52) U.S. Cl.
CPC . *G11C 7/12* (2013.01); *G11C 7/14* (2013.01)

(58) Field of Classification Search
USPC ....................................... 365/189.09, 185.03
See application file for complete search history.

(56) References Cited

U.S. PATENT DOCUMENTS

| | | | | |
|---|---|---|---|---|
| 2009/0144600 A1* | 6/2009 | Perlmutter | .......... | G06F 11/1068 714/763 |
| 2014/0104943 A1* | 4/2014 | Chen | .................. | G11C 11/5642 365/185.03 |
| 2014/0281762 A1* | 9/2014 | Norrie | ................. | G06F 11/2215 714/703 |

FOREIGN PATENT DOCUMENTS

| | | |
|---|---|---|
| KR | 1020100006344 | 1/2010 |
| KR | 1020140091955 | 7/2014 |

* cited by examiner

*Primary Examiner* — Huan Hoang
*Assistant Examiner* — Minh Dinh
(74) *Attorney, Agent, or Firm* — IP & T Group LLP

(57) ABSTRACT

A data storage device includes a memory device including a plurality of memory cells; and a controller suitable for determining, based on data read from the plurality of memory cells, section cell numbers corresponding to threshold voltage sections, and for determining an average threshold voltage of a threshold voltage distribution selected among a plurality of threshold voltage distributions of the memory cells which are estimated based on the section cell numbers, based on a Gaussian distribution function.

20 Claims, 12 Drawing Sheets

| Section | S0 | S1 | S2 | S3 |
|---|---|---|---|---|
| Data Pattern | 11 | 01 | 00 | 10 |
| Section Cell # | 110 | 110 | 120 | 60 |

| PV | PV0 | | PV1 | | PV2 | | PV3 | |
|---|---|---|---|---|---|---|---|---|
| Distribution Cell # | 100 | | 100 | | 100 | | 100 | |
| Partial Cell # | | | 10 | 90 | 20 | 80 | 40 | 60 |
| Area ratio | | | | 0.9 | | 0.8 | | 0.6 |

| Pr_PVR | 0.005 | 0.01 | 0.015 | 0.02 | 0.025 | 0.03 | 0.035 | 0.04 |
|---|---|---|---|---|---|---|---|---|
| $Q^{-1}$ | 2.5758 | 2.3263 | 2.1701 | 2.0537 | 1.9600 | 1.8808 | 1.8119 | 1.7507 |
| Pr_PVR | 0.045 | 0.05 | 0.07 | 0.09 | 0.11 | 0.13 | 0.15 | 0.17 |
| $Q^{-1}$ | 1.6954 | 1.6449 | 1.4758 | 1.3408 | 1.2265 | 1.1264 | 1.0364 | 0.9542 |
| Pr_PVR | 0.19 | 0.21 | 0.23 | 0.25 | 0.27 | 0.29 | 0.31 | 0.33 |
| $Q^{-1}$ | 0.8779 | 0.8064 | 0.7388 | 0.6745 | 0.6128 | 0.5534 | 0.4959 | 0.4399 |
| Pr_PVR | 0.35 | 0.37 | 0.39 | 0.41 | 0.43 | 0.45 | 0.47 | 0.49 |
| $Q^{-1}$ | 0.3853 | 0.3319 | 0.2793 | 0.2275 | 0.1764 | 0.1257 | 0.0753 | 0.0251 |

| Section | S0 | S1 | S2 | S3 |
|---|---|---|---|---|
| Section Cell # | 140 | 120 | 95 | 55 |
| Cumulative Cell # | 140 | 260 | 345 | |
| Reference Cell # | 150 | 250 | 350 | |

DATA STORAGE DEVICE AND OPERATING METHOD THEREOF

CROSS-REFERENCES TO RELATED APPLICATION

The present application claims priority under 35 U.S.C. §119(a) to Korean application number 10-2015-0161811, filed on Nov. 18, 2015, in the Korean Intellectual Property Office, which is incorporated herein by reference in its entirety.

BACKGROUND

1. Technical Field

Various embodiments generally relate to a data storage device and, more particularly, to a data storage device including a semiconductor memory device.

2. Related Art

Data storage devices store data provided by an external device in response to a write request. Data storage devices may also provide stored data to an external device in response to a read request. Examples of external devices that use data storage devices include computers, digital cameras, cellular phones and the like. Data storage devices can be embedded in external devices or fabricated separately and then connected afterwards.

SUMMARY

In an embodiment, a data storage device may include: a memory device including a plurality of memory cells; and a controller suitable for determining, based on data read from the plurality of memory cells, section cell numbers corresponding to threshold voltage sections, and for determining an average threshold voltage of a threshold voltage distribution selected among a plurality of threshold voltage distributions of the memory cells which are estimated based on the section cell numbers, based on a Gaussian distribution function. The controller determines whether a reference voltage is positioned in a selected threshold voltage distribution, based on section cell numbers, and determines to adjust the reference voltage, in the case where the reference voltage not positioned in the selected threshold voltage distribution. The controller sets a new reference voltage by adjusting, using a predetermined offset value, an average threshold voltage of a threshold voltage distribution adjacent to the selected threshold voltage distribution corresponding to the reference voltage.

In an embodiment, a method for operating a data, storage device may include: determining, based on data read from a plurality of memory cells, section cell numbers corresponding to threshold voltage sections and determining an average threshold voltage of a threshold voltage distribution selected among a plurality of threshold voltage distributions of the memory cells which are estimated based on the section cell numbers, based on a Gaussian distribution function. The determining of the section cell numbers corresponding to the threshold voltage sections includes: determining, based on the data read from the plurality of memory cells by applying a reference voltage to the memory cells, the section cell numbers corresponding to the threshold voltage sections which are divided by the reference voltage. The determining of the section cell numbers includes counting the number of memory cells corresponding to respective patterns of the data, as the section cell numbers, and the patterns correspond to the threshold voltage sections. The determining of the average threshold voltage includes: determining an area ratio of a partial distribution which is formed as the selected threshold voltage distribution is divided by the reference voltage, based on the section cell numbers and determining the average threshold voltage, based on the area ratio and a predetermined variance value corresponding to the selected threshold voltage distribution. The determining of the, area ratio includes: determining a partial cell number corresponding to the partial distribution, based on the section cell numbers and distribution cell numbers corresponding to the threshold voltage distributions; and determining the area ratio, based on a ratio of the partial cell number with respect to a distribution cell number corresponding to the selected threshold voltage distribution. The determining of the average threshold voltage includes: determining the average threshold voltage by applying the area ratio to an integral equation for the Gaussian distribution function. The determining of the average threshold voltage includes: determining the average threshold voltage by referring to a table which includes values of a reverse function of a Q function, the values including a value corresponding to the area ratio. The method may further include: determining whether to adjust the reference voltage, based on the section cell numbers; setting a new reference voltage by adjusting the reference voltage according to a determination result; and iterating the determining of section cell numbers, based on the new reference voltage. The determining includes: determining whether the reference voltage is positioned in the selected threshold voltage distribution, based on the section cell numbers and determining to adjust the reference voltage, in the case where the reference voltage is not positioned in the selected threshold voltage distribution. The determining includes: determining whether the reference voltage is positioned in a reliable section excluding a lower unreliable section or an upper unreliable section in the selected threshold voltage distribution based on the section cell numbers; and determining to adjust the reference voltage, in the case where the reference voltage is not positioned in the reliable section. The determining of whether the reference voltage is positioned in the reliable section includes: determining a cumulative cell number which is the number of memory cells having threshold voltages smaller than the reference voltage, based on the section cell number; and determining whether the reference voltage is positioned in the reliable section, by determining whether the cumulative cell number is included in a predetermined range with respect to a predetermined reference cell number. The determining of whether the reference voltage is positioned in the reliable section includes: determining an area ratio of a partial distribution which is formed as the selected threshold voltage distribution is divided by the reference voltage, based on the section cell numbers; and determining whether the reference voltage is positioned in the reliable section, by comparing the area ratio and area ratios of the lower unreliable section and the upper unreliable section. Each of the lower unreliable section and the upper unreliable section has an area ratio larger than a cumulative error rate corresponding to the selected threshold voltage distribution. The setting of the new reference voltage includes: setting an average threshold voltage of a selected threshold voltage distribution corresponding to the reference voltage, as the new reference voltage. The setting of the new reference voltage includes: when the reference voltage is positioned in any one of a lower unreliable section and an upper unreliable section of a corresponding selected threshold voltage distribution, acquiring another reference voltage which is positioned in the other of the lower unreliable section and the upper unreliable section; and setting a middle value of the reference voltage and the another reference voltage, as the new reference voltage. The setting of the new reference voltage includes: setting, when another reference voltage adjacent to the reference voltage is positioned in a reliable section of another threshold voltage distribution adjacent to the selected threshold voltage distribution corresponding to the reference voltage, the new reference voltage by adjusting, using a predetermined offset value, the another reference voltage. The setting of the new reference voltage includes: setting the new reference voltage by adjusting, using a predetermined offset value, an average threshold voltage of a threshold voltage distribution adjacent to a selected threshold voltage distribution corresponding to the reference voltage. The method may further include estimating one or more optimal read voltages for reading data stored in the memory cells, based on the average threshold voltages. The optimal read voltages include a middle value of adjacent average threshold voltages among the average threshold voltages. The optimal read voltages include a value obtained by adding or subtracting a predetermined offset value to or from at least one among the average threshold voltages.

In an embodiment, a data storage device may include: a memory device including a plurality of memory cells; and a controller suitable for determining average threshold voltages of threshold voltage distributions selected among a plurality of threshold voltage distributions of the memory cells, through Gaussian modeling, and estimating one or more optimal read voltages for reading data stored in the memory cells, based on the average threshold voltages. The optimal read voltages comprise a middle value of adjacent average threshold voltages among the average threshold voltages. The optimal read voltages comprise a value obtained by adding or subtracting a predetermined offset value to or from at least one among the average threshold voltages. The controller calculates, based on data read from the memory cells by applying a plurality of reference voltages to the memory cells, section cell numbers corresponding to a plurality of threshold voltage sections which are divided by the reference voltages, and calculates the average threshold voltages of the selected threshold voltage distributions estimated based on the section cell numbers, based on a Gaussian distribution function. The controller counts the numbers of memory cells corresponding to respective patterns of the data, as the section cell numbers, and the patterns correspond to the threshold voltage sections. The controller calculates area ratios of partial distributions which are formed as the selected threshold voltage distributions are divided by the reference voltages, based on the section cell numbers, and calculates the average threshold voltages, based on the area ratios and a predetermined dispersion value corresponding to the selected threshold voltage distributions. The controller calculates partial cell numbers corresponding to the partial distributions, based on the section cell numbers and distribution cell numbers corresponding to the threshold voltage distributions, and calculates the area ratios, based on distribution cell numbers corresponding to the selected threshold voltage distributions and the partial cell numbers. The controller calculates the average threshold voltages by applying the area ratios to an integral equation for the Gaussian distribution function. The controller calculates the average threshold voltages by referring to a table which includes values of a reverse function of a Q function, the values corresponding to the area ratios. The controller determines whether to adjust at least one reference voltage among the reference voltages, based on the section cell voltage according to a determination result, and iterates the calculating of section cell numbers based on reference voltages including the new reference voltage. The controller determines whether the reference voltage is positioned in a corresponding selected threshold voltage distribution, based on the section cell numbers, and determines to adjust the reference voltage, in the case where the reference voltage is not positioned in the selected threshold voltage distribution. The controller determines whether the reference voltage is positioned in a reliable section excluding a lower unreliable section and an upper unreliable section in a corresponding selected threshold voltage distribution, based on the section cell numbers, and determines to adjust the reference voltage in the case, where the, reference voltage is not positioned in the reliable section. The controller calculates a cumulative cell number which is the number of memory cells having threshold voltages smaller than the reference voltage, based on the section cell numbers, and determines whether the reference voltage is positioned in the reliable section, by determining whether the cumulative cell number is included in a predetermined range with respect to a predetermined reference cell number. The controller calculates an area ratio of a partial distribution which is formed as the selected threshold voltage distribution is divided by the reference voltage, based on the section cell numbers, and determines whether the reference voltage is positioned in the reliable section, by comparing the area ratio and area ratios of the lower unreliable section and the upper unreliable section. Each of the lower unreliable section and the upper unreliable section has an area ratio larger than a cumulative error rate corresponding to the selected threshold voltage distribution. The controller sets an average threshold voltage of a selected threshold voltage distribution corresponding to the reference voltage, as the new reference voltage. When the reference voltage is positioned in any one of a lower unreliable section and an upper unreliable section of a corresponding selected threshold voltage distribution, the controller acquires another reference voltage which is positioned in the other of the lower unreliable section and the upper unreliable section, and sets a middle value of the reference voltage and the another reference voltage, as the new reference voltage. When another reference voltage adjacent to the reference voltage is positioned in a reliable section of another threshold voltage distribution adjacent to the selected threshold voltage distribution corresponding to the reference voltage, the controller sets the new reference voltage by adding or subtracting a predetermined offset value to or from the another reference voltage. The controller sets the new reference voltage by adding or subtracting a predetermined offset value to or from an average threshold voltage of a threshold voltage distribution adjacent to a selected threshold voltage distribution corresponding to the reference voltage.

DETAILED DESCRIPTION

Figure 1:
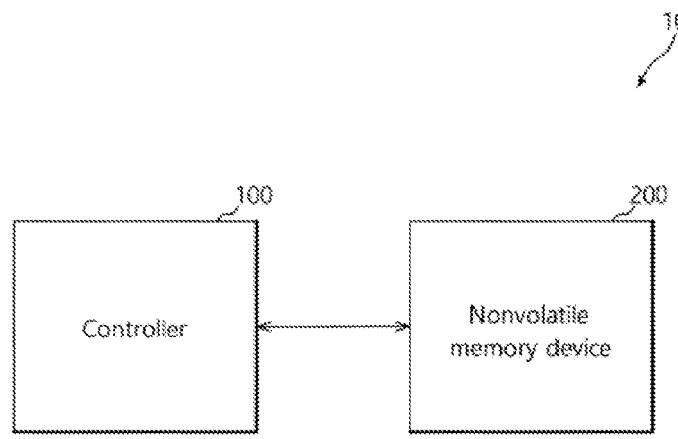
FIG. 1 is a simplified block diagram illustrating a data storage device, according to an embodiment of the invention.

Hereinafter, various embodiments of the present invention will be described with reference to the accompanying drawings. The present invention may, however, be embodied in different forms and should not be construed as being limited to an embodiments set forth herein. Rather, these embodiments are provided to describe the present invention in detail to the extent that a person skilled in the art to which the invention pertains can practice the invention.

Moreover, it is noted that embodiments of the present invention are not limited to the particulars shown in the drawings, that the drawings are not necessarily to scale and, in some instances, proportions may have been exaggerated in order to more clearly depict certain features of the invention. Also, while particular terminology is used, it should be understood that the terminology used is for describing particular embodiments only and is not intended to limit the scope of the present invention.

Referring now to FIG. 1 a data storage device 10 is provided, according to an embodiment of the invention. The data storage device 10 may be prepared in the form of a personal computer memory card international association (PCMCIA) card, a compact flash (CF) card, a smart media card, a memory stick, various multimedia cards (e.g., MMC, eMMC, RS-MMC, and MMC-Micro), various secure digital cards (e.g., SD, Mini-SD, and Micro-SD), a universal flash storage (UFS) a solid state drive (SSD) and the like.

The data storage device 10 may include a controller 100 and a nonvolatile memory device 200.

The controller 100 may control the general operations of the data storage device 10. The controller 100 may store data in the nonvolatile memory device 200 in response to a write request transmitted from an external device (not shown). The controller 100 may read data stored in the nonvolatile memory device 200 and output the read data to the external device in response to a read request transmitted from the external device.

The controller 100 may perform a Gaussian modeling operation (hereinafter, referred to as a GM operation) for estimating an average threshold voltage for each of a plurality of threshold voltage distributions of memory cells. The plurality of threshold voltage distributions of memory cells may include threshold voltage distributions selected from a larger set of a plurality of threshold voltage distributions of memory cells. The plurality of the threshold voltage distributions may be the threshold voltage distributions of two or more of memory cells comprised in one or more pages or one or more memory blocks of a nonvolatile memory device.

The controller 100 may calculate section cell numbers corresponding to respective threshold voltage sections divided by reference voltages, based on data read from memory cells by applying the reference voltages to the memory cells. The controller 100 may then calculate an average threshold voltage of selected threshold voltage distributions estimated based on the section cell numbers, based on a Gaussian distribution function.

The controller 100 may estimate optimal read voltages for reading data stored in the nonvolatile memory device 200, based on the average threshold voltages estimated through the GM operation. The controller 100 may estimate optimal read voltages through the GM operation, for example, in the case where an error correction operation for data read from memory cells of the nonvolatile memory device 200 has failed. The optimal read voltages may be voltages for minimizing error bits in data read from memory cells. The controller 100 may repeat a read operation to re-read data from one or more memory cells based on the estimated optimal read voltages, and perform an error correction operation.

The nonvolatile memory device 200 may store data transmitted from the controller 100, may read the stored data and transmit the read data to the controller 100, under the control of the controller 100. The nonvolatile memory device 200 may include a flash memory device, such as a NAND flash or a NOR flash, a ferroelectrics random access memory (FeRAM), a phase-change random access memory (PCRAM), a magnetoresistive random access memory (MRAM), a resistive random access memory (Re AM) and the like, FIG. 2 illustrates an example of the nonvolatile memory device 200 shown in FIG. 1, according to an embodiment of the invention.

Figure 2:
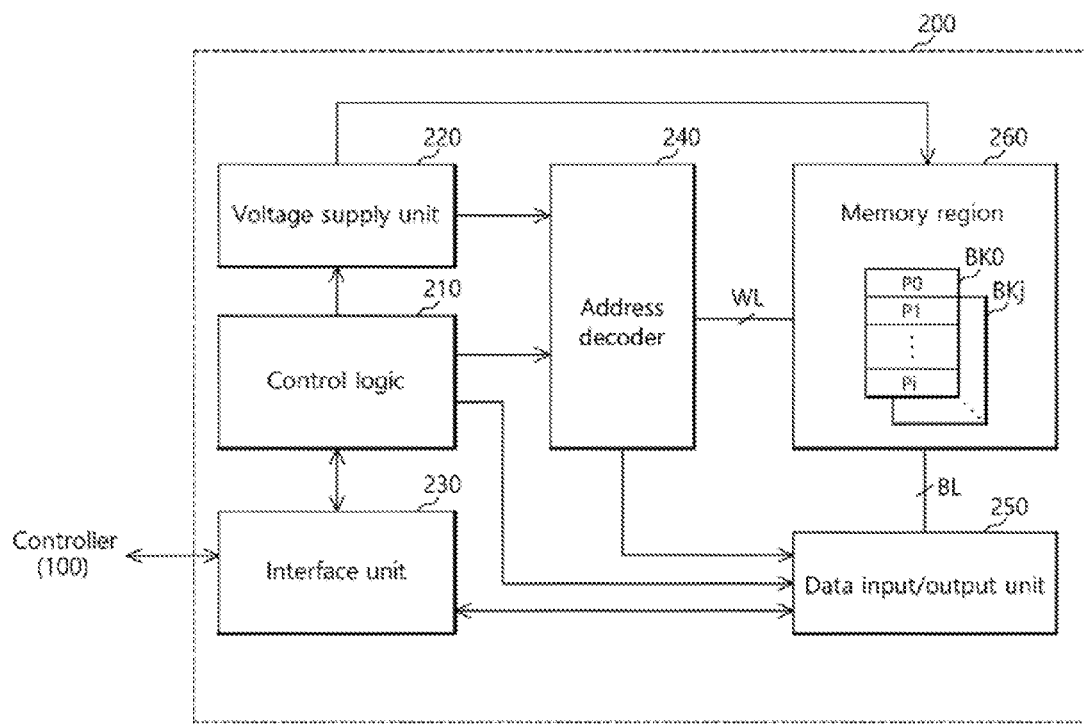
FIG. 2 is a block diagram illustrating an example of the nonvolatile memory device shown in FIG. 1.

Referring to FIG. 2, the nonvolatile memory device 200 may include a control logic 210, a voltage supply unit 220, an interface unit 230, an address decoder 240, a data input/output unit 250, and a memory region 260.

The control logic 210 may control the general operations of the nonvolatile memory device 200 under the control of the controller 100. The control logic 210 may, for example, receive a command transmitted from the controller 100, via the interface unit 230, and may transmit one or more control signals to internal units of the nonvolatile memory device 200 in response to the received command.

The voltage supply unit 220 may generate various operation voltages necessary for performing the general operations of the nonvolatile memory device 200, according to control of the control logic 210. For example, the voltage supply unit 220 may supply various voltages to be used in write and read operations, to the address decoder 240. For example, the voltage supply unit 220 may supply an erase voltage necessary for an erase operation, to a memory block selected in the memory region 260.

The interface unit 230 may exchange various control and/or data signals including commands, addresses, and data with the controller 100. The interface unit 230 may transmit various control and/or data signals inputted thereto, to the internal units of the nonvolatile memory device 200.

The address decoder 240 may decode addresses for selecting sections of the memory region 260 to be accessed. The address decoder 240 may selectively drive one or more word lines WL of the memory region 260, according to the decoding results. The address decoder 240 may control the data input/output unit 250 for selectively driving one or more bit lines BL of the memory region, according to the decoding results.

The data input/output unit 250 may transmit data received from the interface unit 230 to the memory region 260 through one or more bit lines BL. The data input/output unit 250 may transmit data read from the memory region 260 through one or more bit lines BL to the interface unit 230. The data input/output unit 250 may sense a current formed as memory cells included in the memory region 260 are turned on and off in response to a read voltage, and may acquire data read from the memory cells, according to the sensed results.

The memory region 260 may be coupled with the address decoder 240 through the plurality of word lines WL. The memory region 260 may be coupled with the data input/output unit 250 through the plurality of bit lines BL. The memory region 260 may include a plurality of memory cells for storing data. The memory cells may be disposed at areas where the word lines WL and the, bit lines BL intersect each other. The memory region 260 may include memory cell arrays of a two-dimensional or three-dimensional structure.

The memory region 260 may include a plurality of memory blocks BK0 to BKj. Each of the memory blocks BK0 to BKj may include a plurality of pages P0 to Pi. A memory block may be, for example, a unit by which an erase operation is performed. A page may be, for example, a unit by which a write operation and or a read operation is performed. However, it is to be noted that the invention is not limited in this way and many other suitable configurations may be employed. For example, the memory storage may employ a folded bit line architecture.

Figure 3A:
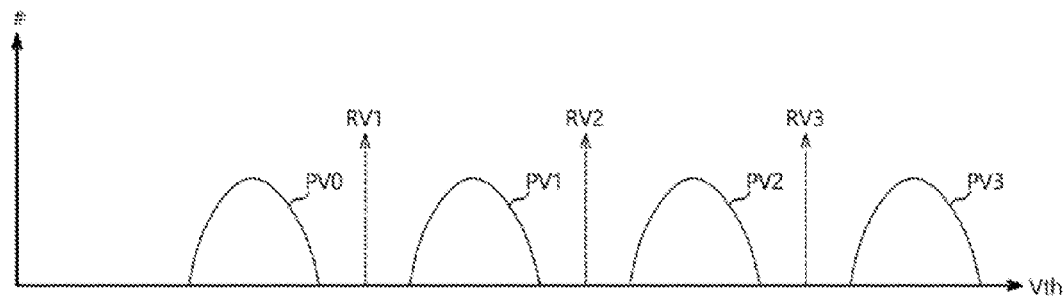
FIG. 3A is a diagram illustrating an example of threshold voltage distributions of memory cells.

Referring now to FIG. 3A an example of threshold voltage distributions PV0 to PV3 of a plurality of memory cells is provided. The horizontal axis Vth represents a threshold voltage of a memory cell, and the vertical axis Cell # represents the number of memory cells corresponding to a threshold voltage.

As shown in FIG. 3A, memory cells may form a plurality of threshold voltage distributions PV0 to PV3 according to data stored therein. When, for example, 2-bit data of "11", "01", "00" or "10" is stored in a memory cell, the memory cell may be controlled to have a threshold voltage corresponding to any one of the 4 threshold voltage distributions PV0 to PV3, according to data stored therein.

A memory cell may be turned on or off in response to a predetermined read voltage according to a threshold voltage. For example, a memory cell may be turned on when a read voltage higher than its threshold voltage is applied, and may be turned off when a read voltage lower than its threshold voltage is applied. For example, data "1" may be read when a memory cell is turned on, and, for example data "0" may be read when a memory cell is turned off. Data may be read by sensing current which is formed as a memory cell is turned on or off. Data read from a memory cell may be different according to a read voltage applied to the memory cell. A read operation for a memory cell may be performed by applying a predetermined read voltage to the memory cell, to read data from the memory cell.

Data stored in a memory cell may be determined based on data read from the memory cell in response to one or more appropriate read voltages. For example, data "0" may be read from a memory cell forming the threshold voltage distribution PV2 by applying a read voltage RV2 whereas data "1" may be read from the memory cell by applying a read voltage RV3 and, based on these data, data stored in the corresponding memory cell may be determined as "00". One or more read voltages RV1 to RV3 for reading data stored in memory cells may be respectively positioned between the threshold voltage distributions PV0 to PV3 to identify the threshold voltage distributions PV0 to PV3 of the memory cells.

For suppressing interference between memory cells, data may be stored in memory cells after being randomized. Accordingly, the number of memory cells for each threshold voltage distribution PV0 to PV3, may be the same. For example, if the total number of memory cells is "400", the number of memory cell s corresponding to each of the threshold voltage distributions PV0 to PV3 may be "100".

Figure 3B:
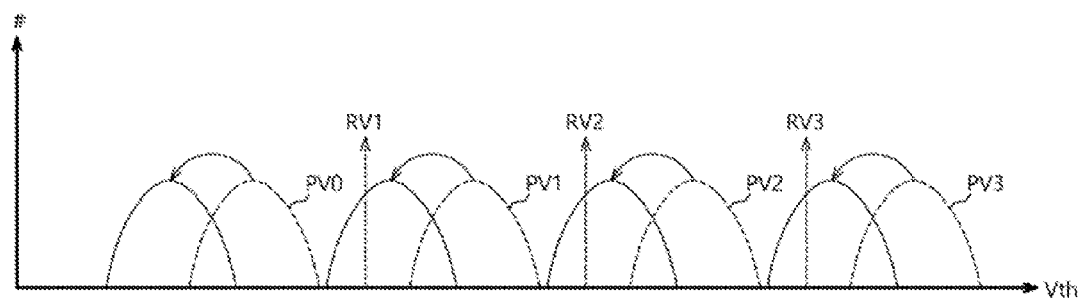
FIG. 3B is a diagram illustrating an example of movements of threshold voltage distributions.

Referring to FIG. 3B a diagram illustrating an example of movements of the threshold voltage distributions PV0 to PV3 of FIG. 3A, is provided.

Memory cells may have varied threshold voltages for various reasons, such as, for example, interference between adjacent memory cells and discharge due to lapse of time, and thus, the threshold voltage distributions PV0 to PV3 may be moved. As a result, the read voltages RV1 to RV3 which have been set to be positioned between the threshold voltage distributions PV0 to PV3 to identify the threshold voltage distributions PV0 to PV3 may fall within a varied threshold voltage distribution. In the case where the read voltages RV1 to RV3 are not positioned between the threshold voltage distributions PV0 to PV3, data stored in memory cells may not be accurately read, and data read from the memory cells may include error bits. In the case where read data include error bits exceeding the error correction capability of an error correction code (ECC) unit, the ECC unit may fail in an error correction operation.

The controller 100 may estimate optimal read voltages which are positioned between the moved threshold voltage distributions, and may set the estimated optimal read voltages as read voltages for reading data stored in the memory cells. The optimal read voltages may be voltages which are positioned in valleys between the moved threshold voltage distributions. The optimal read voltages may be voltages for minimizing error bits included in data read from the memory cells.

According to an embodiment, optimal read voltages may be effectively set based on average threshold voltages of threshold voltage distributions, which are calculated through a GM operation. Accordingly, as the number of error bits is minimized, performance of the data storage device 10 may be improved.

While it is illustrated in FIGS. 3A and 3B that memory cells form 4 threshold voltage distributions PV0 to PV3 and data are read based on 3 read voltages RV1 to RV3, it is to be noted that the embodiment is not limited to such. Memory cells may form a plurality of threshold voltage distributions according to the number of bits to be stored in each memory cell, and data stored in the memory cells may be read based on a plurality of read voltages capable of identifying the plurality of threshold voltage distributions.

Figures 4, 5:
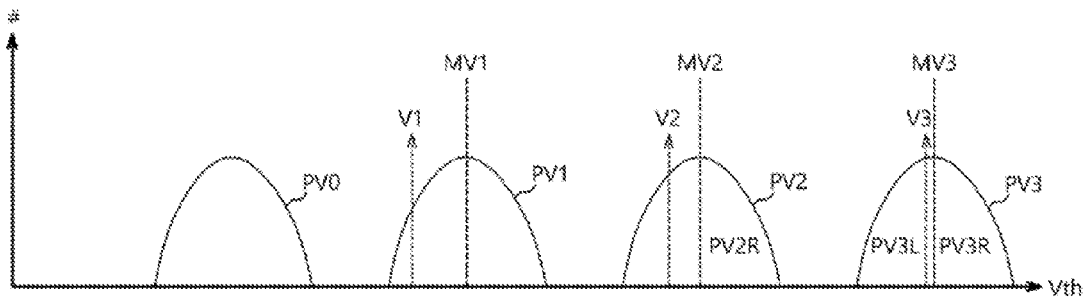
FIG. 4 is a diagram illustrating a method of performing a Gaussian Modelling operation for the controller of FIG. 1, according to an embodiment of the invention.
FIG. 5 is a table showing values of the reverse function of a Q function for area ratios, according to an embodiment of the invention.

Referring to FIG. 4, the controller 100 may generate a Gaussian-model for each of the threshold voltage distributions PV1 to PV3, based on reference voltages V1 to V3. The controller 100 may calculate an average threshold voltage MV1 to MV3 for each of the threshold voltage distributions PV1 to PV3, by Gaussian-modeling the threshold voltage distributions PV1 to PV3.

First, in order to perform the GM operation, predetermined reference voltages V1 to V3 may be used. According to an embodiment, the controller 100 may use the read voltages RV1 to RV3 of FIG. 3B which have been used to read data stored in memory cells, as the reference voltages V1 to V3. The reference voltages V1 to V3 may be respectively positioned in the threshold voltage distributions PV1 to PV3 which are to be Gaussian-modeled. Accordingly, in the case where the read voltages RV1 to RV3 positioned between the threshold voltage distributions PV0 to PV3 before the threshold voltage distributions PV0 to PV3 are moved are positioned in the threshold voltage distributions PV1 to PV3 due to variation of the threshold voltage distributions PV0 to PV3, the read, voltages RV1 to RV3 may be used as the reference voltages V1 to V3 in the GM operation.

According to an embodiment, the controller 100 may use predetermined initial values set for the GM operation, as the reference voltages V1 to V3.

According to an embodiment, the controller 100 may generate a Gaussian-model for at least one threshold voltage distribution selected among the threshold voltage distributions PV0 to PV3. In this case, the controller 100 may perform the GM operation according to an operation method to be described herein below, based on a reference voltage positioned in the selected threshold voltage distribution.

The controller 100 may calculate the number of memory cells corresponding to respective threshold voltage sections S0 to S3 which are divided by the reference voltages V1 to V3, as section cell numbers (Section Cell #) based on data read from memory cells by applying the reference voltages V1 to V3 to the memory cells.

For example, the controller 100 may acquire patterns of data through a read operation using the reference voltages V1 to V3 for the memory cells. Patterns of data may be acquired as "11", "01", "00" or "10," as described above with reference to FIG. 3A. The acquired patterns of data may be different from data actually stored in the memory cells. For example, while data actually stored in memory cells of a left partial distribution PV3L of the threshold voltage distribution PV3 is "10", the pattern of data acquired from the corresponding memory cells will be "00".

The controller 100 may count the number of memory cells corresponding to the respective patterns of data, as the section cell numbers. Since the threshold voltage sections S0 to S3 divided by the reference voltages V1 to V3 respectively correspond to different data patterns, the section cell numbers may respectively correspond to the threshold voltage sections S0 to S3 according to the patterns of data. For example, the controller 100 may calculate a section cell number "60" corresponding to the threshold voltage section S3, by counting "60" memory cells from which the data pattern "10" is acquired, among a total of "400" memory cells.

The controller 100 may estimate a distribution cell number (Distribution cell #) by assuming that the same number of memory cells have threshold voltages corresponding to each of the respective threshold voltage distributions PV0 to PV3. According to an embodiment, the controller 100 may estimate of distribution cell numbers by referring to data actually written in memory cells. In the example of FIG. 4, a distribution cell number of "100" may be applied by assuming that the number of memory cells having threshold voltages falling within each of the threshold voltage distributions PV0 to PV3 is uniform and the total number of memory cells is "400."

Then, the controller 100 may calculate partial cell numbers (Partial Cell #) corresponding to partial distributions (PV), based on the section cell numbers (Section cell #) and the distribution cell number. A partial distribution (PV) may be formed if a threshold voltage distribution PV1 to PV3 is divided by a reference voltage V1 to V3. For example, as shown in FIG. 4, a section cell number corresponding to the threshold voltage section S3 may be "60", hence, a partial cell number corresponding to a partial distribution PV3R may be "60". A partial cell number corresponding to the partial distribution PV3L may be "40" obtained by subtracting "60" from the distribution cell number "100" corresponding to the threshold voltage distribution PV3. A partial cell number corresponding to a partial distribution PV2R may be "80" obtained by subtracting "40" from a section cell number "120" corresponding to the threshold voltage section S2.

The controller 100 may calculate area ratios corresponding to partial distributions, based on distribution cell numbers and the partial cell numbers (Partial Cell #). In FIG. 4, the controller 100 calculates area ratios for partial distributions on right sides of the reference voltages V1 to V3 with respect to the threshold voltage distributions PV1 to PV3. However, it is noted that, according to an embodiment, the controller 100 may calculate area ratios for partial distributions on left sides of the reference voltages V1 to V3 with respect to the threshold voltage distributions PV1 to PV3. An area ratio is a ratio of a partial distribution with respect to a corresponding threshold voltage distribution, and represents a probability of memory cells to exist in the partial distribution in the corresponding threshold voltage distribution.

A method for calculating an average threshold voltage m of a certain threshold voltage distribution PV based on an area ratio of a partial distribution of the threshold voltage distribution PV will be described below. The method may be performed by the controller 100.

A threshold voltage distribution PV may be modelled as a Gaussian distribution expressed by the following Equation 1, wherein "vth" is a threshold voltage, is an average threshold voltage, and "σ" is a variance.

$$PV = 1/(2\sqrt{\pi}\sigma) * e^{-(vth-m)^2/(2\sigma^2)}. \quad (1)$$

Accordingly, the following Equation 2 may be established for an area ratio Pr_PVR(v) of a right partial distribution divided by a reference voltage v in the threshold voltage distribution PV.

$$Pr\_PVR(v) = \int_v^\infty 1/(2\sqrt{\pi}\sigma) * e^{-(vth-m)^2/(2\sigma^2)} dvth. \quad (2)$$

The variance σ of the threshold voltage distribution PV may not vary substantially. Accordingly, if the variance σ of threshold voltage distributions PV is set to be a suitable constant, an average threshold voltage m may be calculated from the Equation 2.

According to an embodiment, the average threshold voltage m may be calculated using a Q function characteristic.

For example, the threshold voltage distribution PV modeled as a Gaussian distribution may be standardized as a standard Gaussian distribution. The standardized threshold voltage distribution may be converted into the following Equation 3.

$$SPV=1/(2\sqrt{\pi})*e^{-y^2/2}. \quad (3)$$

A Q function expressed by the following Equation 4 is a probability of a random variable of a standard Gaussian distribution to have a value larger than "z".

$$Q(z)=\int_z^\infty 1/(2\sqrt{\pi})*e^{-y^2/2}\,dy. \quad (4)$$

Accordingly, by the following Equation 5, the Equation 6 may be established based on the Equation 2 and the Equation 4.

$$z=(v-m)/\sigma. \quad (5)$$

$$Q(z)=Pr\_PVR(v). \quad (6)$$

Since a value of Q(z) for a value of z is known, the value of z may be known when the value of Q(z) is known. Therefore, finally, the following Equation 7 may be derived through the Equation 5 and the Equation 6.

$$m=v-Q^{-1}(Pr\_PVR(v))\sigma. \quad (7)$$

wherein, $Q^{-1}$ is the reverse function of Q(z), v is a reference voltage and m is an average threshold voltage.

FIG. 5 shows an example of a table in which values of the reverse function $Q^{-1}$ of the Q function for area ratios Pr_PVR are arranged exemplarily.

The controller 100 may extract a value of the reverse function $Q^{-1}$ of the Q function corresponding to an area ratio Pr_PVR(v), by referring to the table of FIG. 5. The controller 100 may efficiently calculate the average threshold voltage m using Equation 7 based on the reference voltage v, the value of the reverse function $Q^{-1}$ of the Q function and the predetermined variance σ.

Meanwhile, because a variation in a value of the reverse function $Q^{-1}$ of the Q function for an area ratio Pr_PVR may be large near tail portions of a standard Gaussian distribution, in order to decrease errors, the table may include area ratios Pr_PVR and corresponding values of the reverse function $Q^{-1}$ of the Q function, which are finely set from 0 to a predetermined value, for example, "0.05", as shown in FIG. 5.

As may be readily seen from FIG. 5, even though the table is constructed for only area ratios Pr_PVR less than 0.5, the controller 100 may easily calculate values of the reverse function $Q^{-1}$ of the Q function for area ratios Pr_PVR equal to or greater than 0.5, based on the symmetry of the Q function. According to an embodiment, the table of FIG. 5 may be constructed to include values corresponding to area ratios Pr_PVR equal to or greater than 0.5.

According to an embodiment, the table may be stored in the nonvolatile memory device 200, and may be loaded on a memory (not shown) in the controller 100, for reference.

Figure 6A:
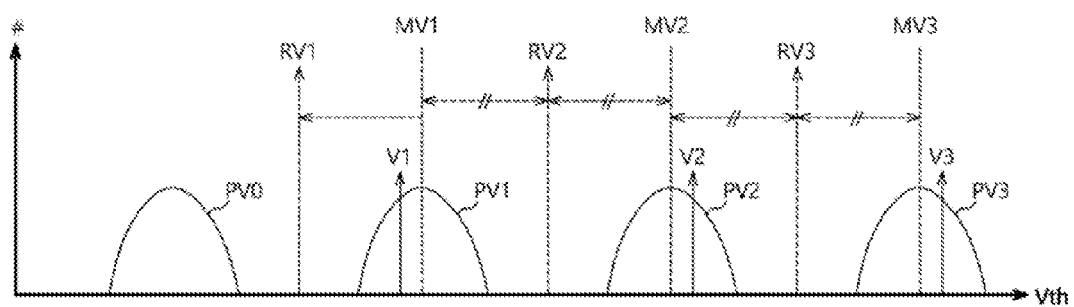
FIGS. 6A and 6B are examples of diagrams illustrating methods of estimating optimal read voltages based on average threshold voltages, according to an embodiment of the invention.
Figure 6B:
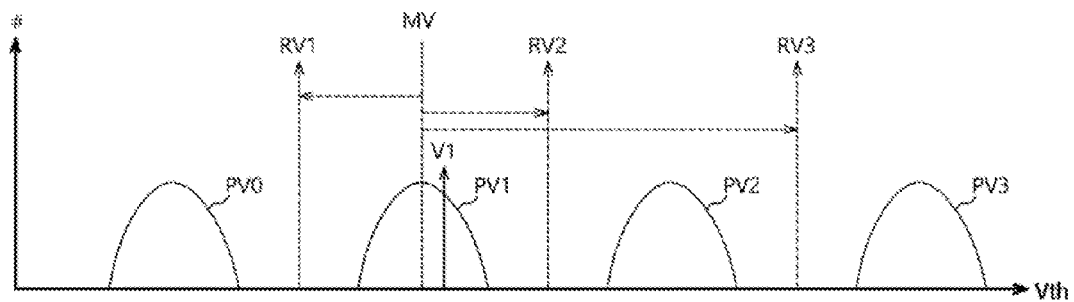

FIGS. 6A and 6B are diagrams illustrating methods for estimating optimal, read voltages RV1 to RV3, based on average threshold voltages of threshold voltage distributions PV1 to PV3. The controller 100 of FIG. 1 may estimate the optimal read voltages RV1 to RV3.

Referring to FIG. 6A, average threshold voltages MV1 to MV3 of the threshold voltage distributions PV1 to PV3 may be respectively calculated through the GM operation based on reference voltages V1 to V3 respectively positioned in the threshold voltage distributions PV1 to PV3. The controller 100 may estimate the middle value of average threshold voltages of 2 adjacent threshold voltage distributions, as an optimal read voltage. For example, the middle value of the average threshold voltages MV1 and MV2 may be estimated as the optimal read voltage RV2 whereas the middle value of the average threshold voltages MV2 and MV3 may be estimated as the optimal read voltage RV3. Meanwhile, when an average threshold voltage of a threshold voltage distribution PV0 which is not Gaussian-modeled does not exist, the optimal read voltage RV1 may be set as a value obtained by subtracting a predetermined offset value from the average threshold voltage MV1. The predetermined offset value may be set taking into consideration the widths of the threshold voltage distributions PV0 to PV3 and the intervals between the threshold voltage distributions PV0 to PV3.

Referring to FIG. 6B, for example, an average threshold voltage MV of a threshold voltage distribution PV1 may be calculated through the GM operation, based on e reference voltage V1 positioned in the threshold voltage distribution PV1. In this case, optimal read voltages RV1 to RV3 may be set as values obtained by adding or subtracting predetermined offset values to or from the average threshold voltage MV. The predetermined offset values may be set taking into consideration the widths of the threshold voltage distributions PV0 to PV3 and the intervals between the threshold voltage distributions. That is to say the optimal read voltages RV to RV3 may be calculated through the average threshold voltage of certain one among threshold voltage distributions.

A method for adjusting reference voltages to improve performance of the GM operation will be described below. The controller 100 of FIG. 1 may perform the GM operation based on adjusted new reference voltages.

Figure 7:
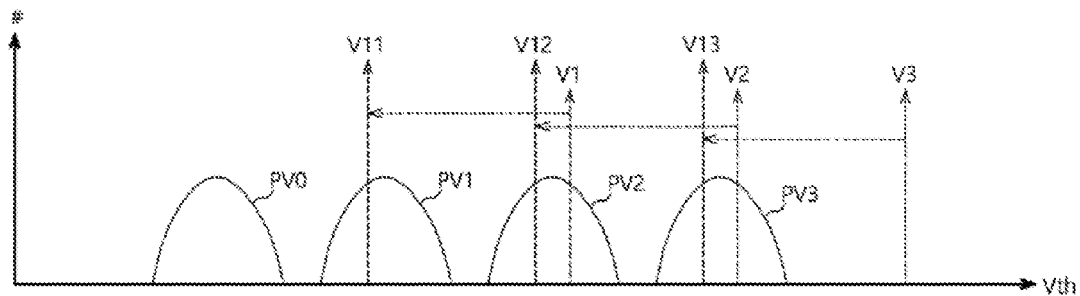
FIG. 7 is an example of a method of adjusting reference voltages, according to an embodiment of the invention.

FIG. 7 illustrates a method for adjusting reference voltages. The method may be performed by the controller 100 of FIG. 1.

Referring to FIG. 7, based on the section cell numbers corresponding to reference voltages, the controller 100 may determine whether the reference voltages fall within respective threshold voltage distributions to be Gaussian-modeled. The controller may adjust a reference voltage in the case where the reference voltage is not respectively positioned within a respective threshold voltage distribution to be Gaussian-modeled. This is because, in order for the threshold voltage distributions to be Gaussian-modeled, area ratios of partial distributions which are divided by the reference voltages should be calculated.

For example, when reference voltages V1 and V2 are positioned within threshold voltage distributions PV2 and PV3, respectively, (as shown in FIG. 7) the average threshold voltage of a threshold voltage distribution PV1 cannot be calculated through Gaussian modeling. In this case, if the distribution cell numbers of the threshold voltage distributions PV0 and PV1 are respectively "100", because the section cell number (Section Cell #) corresponding to a threshold voltage section S0 exceeds "200" and the section cell number (Section Cell #) corresponding to a threshold voltage section S3 is "0", the controller 100 may determine that reference voltages V1 to V3 are not positioned within the threshold voltage distributions PV1 to PV3. Therefore, the controller 100 may adjust the reference voltages V1 to V3 to reference voltages V11 to V13 to be positioned within the threshold voltage distributions PV1 to PV3, respectively.

Figure 8:
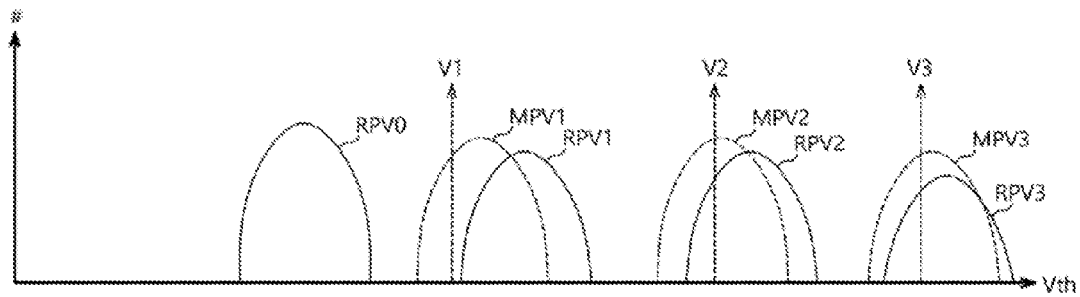
FIG. 8 is an example illustrating cumulative error rates of threshold voltage distributions.

FIG. 8 illustrates cumulative error rates of threshold voltage distributions PV0 to PV3.

More specifically, referring to FIG. 8, threshold voltage distributions RPV0 to RPV3 may be real threshold voltage distributions which are formed by memory cells, and threshold voltage distributions MPV1 to MPV3 may be threshold voltage distributions which are Gaussian-modeled based on reference voltages V1 to V3 according to the above-described method. As described above, uniform cell numbers may be applied by assuming that all distribution cell numbers (Distribution #) corresponding to the threshold voltage distributions RPV0 to RPV3 are uniform. This may allow performing the GM operation more quickly than if real cell numbers (Real Cell #) were applied. However, if substantial errors exist between the uniform cell number applied as the distribution cell number and the real cell numbers, that is, if the error rates of the distribution cell number with respect to real cell numbers corresponding to threshold voltage distributions are substantial, the Gaussian-modeled threshold voltage distributions MPV1 to MPV3 may differ substantially from the real threshold voltage distributions RPV1 to RPV3. In the case where a cumulative error rate as in the threshold voltage distribution MPV1, that is, a cumulative value of error rates from the outermost threshold voltage distribution MPV3 to the corresponding threshold voltage distribution MPV1 is not sufficiently small, performance of the Gaussian modeling may be substantially degraded. To reduce such errors and improve the effectiveness of the Gaussian modelling operation, data should be randomized before applying the Gaussian model operation.

Figure 9:
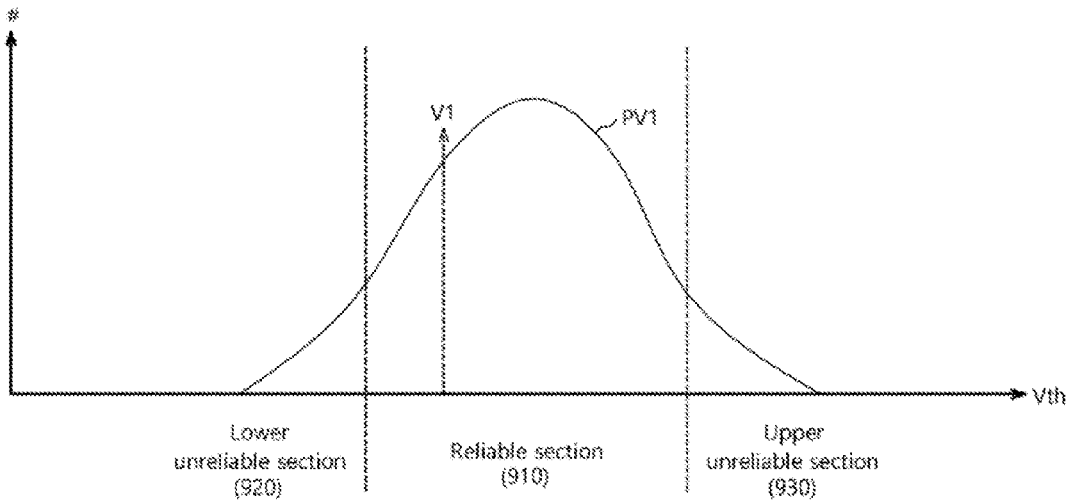
FIG. 9 illustrates an example of a threshold voltage distribution being divided in a central reliable section and two side unreliable sections, according to an embodiment of the invention.

FIG. 9 is a diagram of a threshold voltage distribution PV1 divided in a central reliable section 910 and two side unreliable sections 920 and 930.

Referring to FIG. 9, the controller 100 may use a reference voltage V1 positioned within the central reliable section 910 of the threshold voltage distribution PV1, to Gaussian-model the threshold voltage distribution PV1. Hence, the controller 100 may determine whether a reference voltage is positioned within the reliable section 910 or within one of the lower or upper unreliable sections 920 or 930. The controller may adjust the reference voltage to be positioned within the reliable section 910, when the reference voltage is positioned in a lower unreliable section 920 or an upper unreliable section 930, and may then, perform the GM operation using the adjusted reference voltage.

The reliable section 910 may be set taking into consideration a cumulative error rate corresponding to the threshold voltage distribution PV1 Because the threshold voltage distribution PV1 is concentrated at a center portion and a variation in threshold voltage with respect to a variation in the number of memory cells is relatively large near tail portions, an average threshold voltage calculated through the GM operation based on a reference voltage positioned near a tail portion with a cumulative error rate existing may deviate substantially from a real average threshold voltage. Therefore, the tail portions of the threshold voltage distribution PV1 may be designated as unreliable sections in consideration of cumulative error rates. In more detail, area ratios respectively corresponding to the lower unreliable section 920 and the upper unreliable section 930, that is, threshold area ratios, may be set to be larger than the cumulative error rates. The cumulative error rates may be measured by testing the randomizing performance of the data storage device 10.

According to an embodiment, reliable sections for a plurality of threshold voltage, distributions may be set differently from one another based on their respective cumulative error rates. According to another embodiment, reliable sections for a plurality of threshold voltage distributions may be set as the same value based on a largest cumulative error rate.

In the case where the area ratio of a right or left partial distribution with respect to the reference voltage V1 in the threshold voltage distribution PV1 satisfies the following Equation 8, the controller 100 may determine that the reference voltage V1 is positioned in the reliable section 910.

$$\text{Threshold area ratio} < \text{area ratio of a partial distribution} < 1 - \text{threshold area ratio}. \quad (8)$$

According to the Equation 8, for example, when the area ratio of a right partial distribution with respect to the reference voltage V1 is "65" and a threshold area ratio is "20", it may be determined that the reference voltage V1 is positioned in the reliable section 910.

Hence, even when an error may exist between a uniform cell number applied as a distribution cell number and a real cell number when the GM operation is performed, when a reference voltage is positioned in the reliable section 910 of the threshold voltage distribution PV1, an average threshold voltage may be calculated that has a slight difference from a real average threshold voltage. Accordingly, the GM operation may be performed at a high speed and with sufficient precision, As will be described below, the controller 100 may determine whether a reference voltage is positioned in a reliable section, by referring to not the area ratio of a partial distribution but a cumulative cell number.

Figure 10:
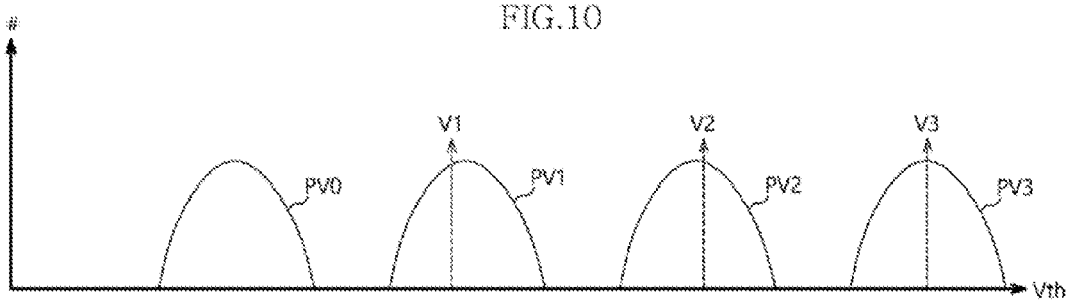
FIG. 10 illustrates a plurality of threshold voltage distributions, threshold voltage sections corresponding to reference voltages V1, V2, and V3, and respective section, cumulative, and reference cell numbers used in a method for determining whether a reference voltage is positioned in a reliable section, according to an embodiment of the invention.

Referring now to FIG. 10, the controller 100 may calculate cumulative cell numbers (Cumulative Cell #) corresponding to respective reference voltages V1 to V3 by cumulating section cell numbers (Section Cell #) corresponding to threshold voltage sections S0 to S3, calculated based on the reference voltages V1 to V3 according to the above-described method. In other words, a cumulative cell number may be the number of cells which have threshold voltages smaller than a corresponding reference voltage. When a cumulative cell number for each of the threshold voltage sections S0 to S2 is included within a predetermined range with respect to a reference cell number (Reference Cell #), the controller 100 may determine that a reference voltage is positioned in a reliable section. A reference cell number may be the number of memory cells which have threshold voltages smaller than a corresponding average threshold voltage when threshold voltage distributions PV0 to PV3 are uniform. The predetermined range with respect to the reference cell number may be set taking into consideration of a cumulative error rate.

Meanwhile, the controller 100 may determine whether a reference voltage is positioned in a lower unreliable section or an upper unreliable section in a corresponding threshold voltage distribution. According to the determination, the controller 100 may adjust the reference voltage by adding or subtracting a predetermined offset value to or from the reference voltage so that a reference voltage is positioned in a reliable section. According to various embodiment, the controller 100 may adjust a reference voltage by employing, for example, one of the methods to be described below.

FIGS. 11A to 11D are diagrams illustrating various methods for adjusting a reference voltage V1 positioned within an unreliable section corresponding to a threshold voltage distribution PV1.

Figure 11A:
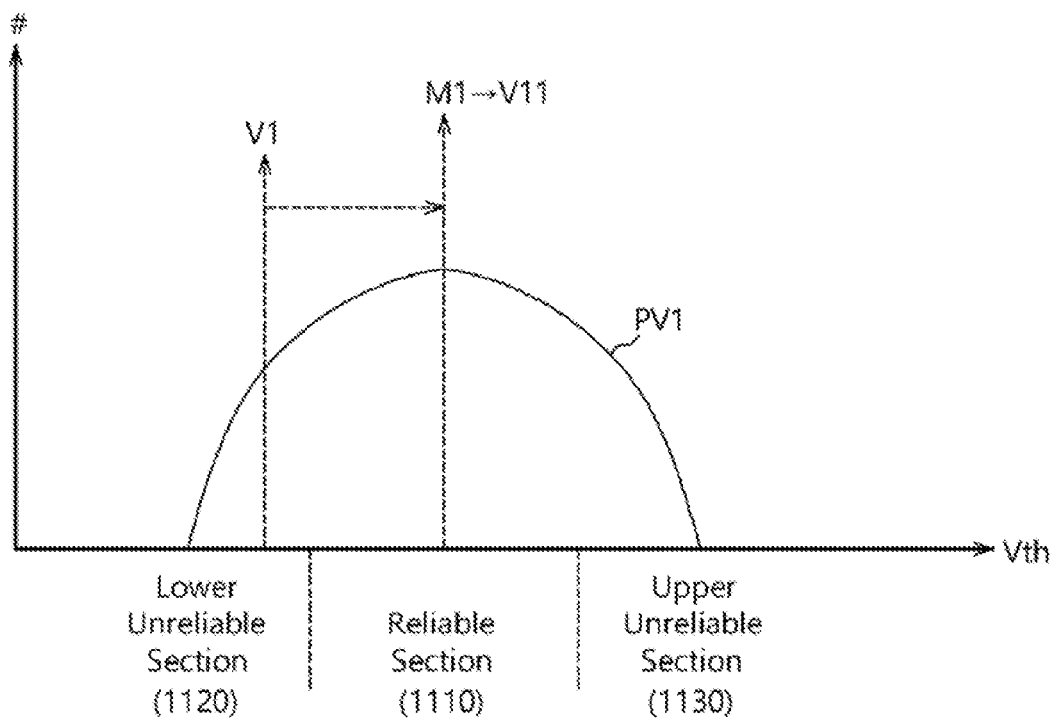
FIGS. 11A to 11D are diagrams of threshold voltage distributions illustrating methods for adjusting a reference voltage positioned in an unreliable section corresponding to a threshold voltage distribution, according to embodiments of the invention.

Referring to FIG. 11A, the controller 100 may calculate an average threshold voltage by performing the above-described GM operation based on the reference voltage V1 determined as being positioned in a lower unreliable section 1120, and may set the calculated average threshold voltage as a new reference voltage V11. It is noted, that the same method may be employed when the reference voltage is positioned in an upper unreliable section 1130 of the threshold voltage distribution PV1.

Figure 11B:
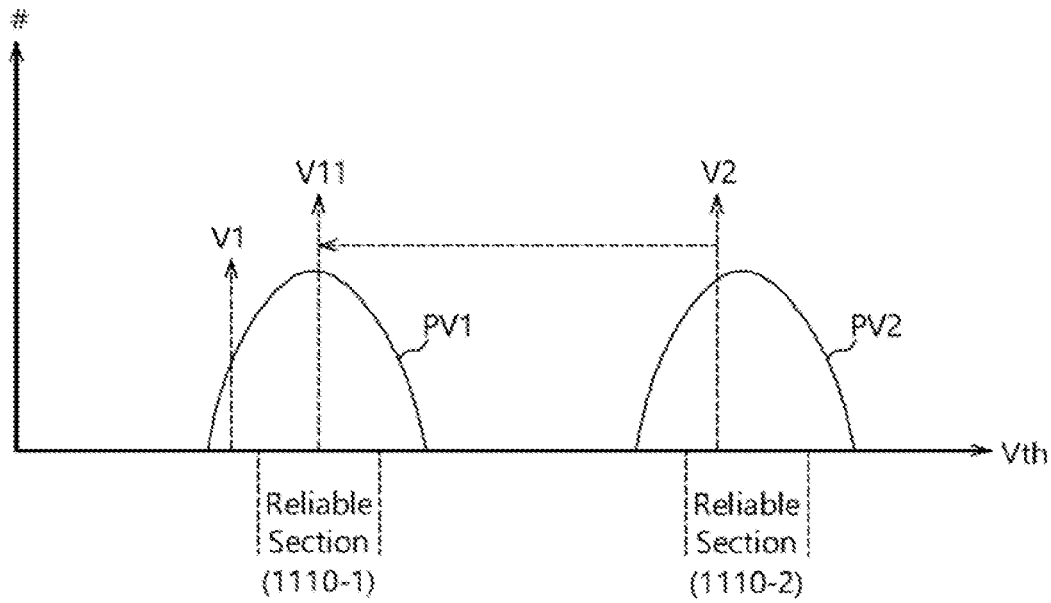

Referring to FIG. 11B, if it is determined that an adjacent reference voltage V2 positioned in an adjacent threshold voltage distribution PV2 is positioned in a reliable section 1110-2, the controller 100 may set a value obtained by adding or subtracting a predetermined offset value to or from the adjacent reference voltage V2, as a new reference voltage V11 corresponding to the threshold voltage distribution PV1 to be positioned in a reliable section 1110-1. In this case, the predetermined offset value may be set taking into account the widths of the threshold voltage distributions PV1 and PV2 and the interval between the threshold voltage distributions PV1 and PV2.

Figure 11C:
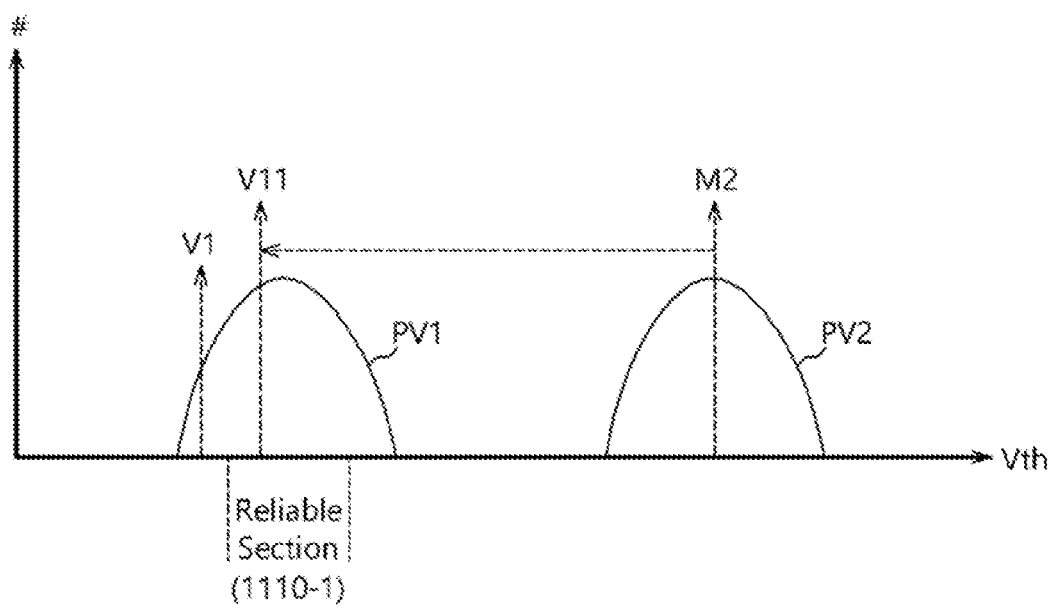

Referring to FIG. 11C, the controller 100 may set a value obtained by adding or subtracting a predetermined offset value to or from an average threshold voltage M2 of an adjacent threshold voltage distribution PV2, as a new reference voltage V11 corresponding to the threshold voltage distribution PV1 to be positioned in a reliable section 1110-1. In this case, the predetermined offset value may be set taking into account the widths of the threshold voltage distributions PV1 and PV2 and the interval between the threshold voltage distributions PV1 and PV2.

Figure 11D:
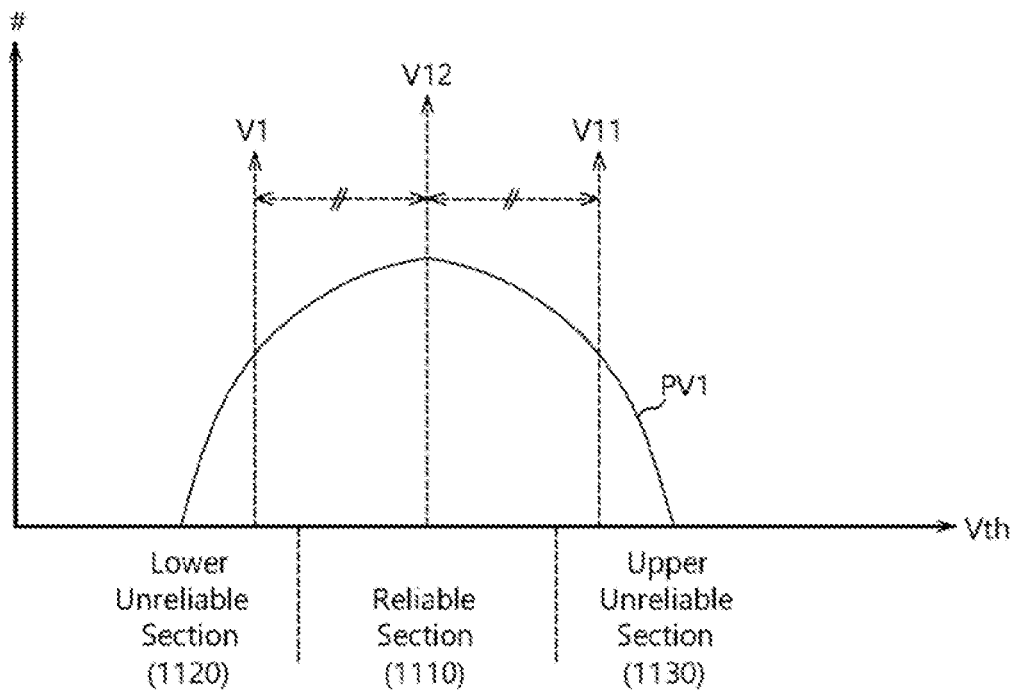

Referring to FIG. 11D, the controller 100 may set a middle value of a reference voltage V1 determined as being positioned in a lower unreliable section 1120 and a reference voltage V11 determined as being positioned in an upper unreliable section 1130, as a new reference voltage V12 to be positioned in a reliable section 1110. This method may be performed, for example, when the reference voltages V1 and V11 which are positioned in the lower and the upper unreliable sections 1120 and 1130, respectively, are acquired through the above-described methods.

The controller 100 may repeat a determination as to whether an adjusted new reference voltage is positioned in a reliable section. If the new reference voltage is still positioned within an unreliable section, the controller 100 may iterate the, adjustment of the reference voltage until an adjusted reference voltage is positioned in a reliable section. For example, the controller may repeat the adjustment method up to a predetermined threshold count. According to an embodiment, the controller 100 may iterate the above-described various methods for adjusting a reference voltage, by appropriately combining them. In the case where a reference voltage positioned in a reliable section is not set even though adjustment of a reference voltage is iterated up to the predetermined threshold count, the controller 100 may abandon Gaussian modeling for a corresponding threshold voltage distribution.

Figure 12:
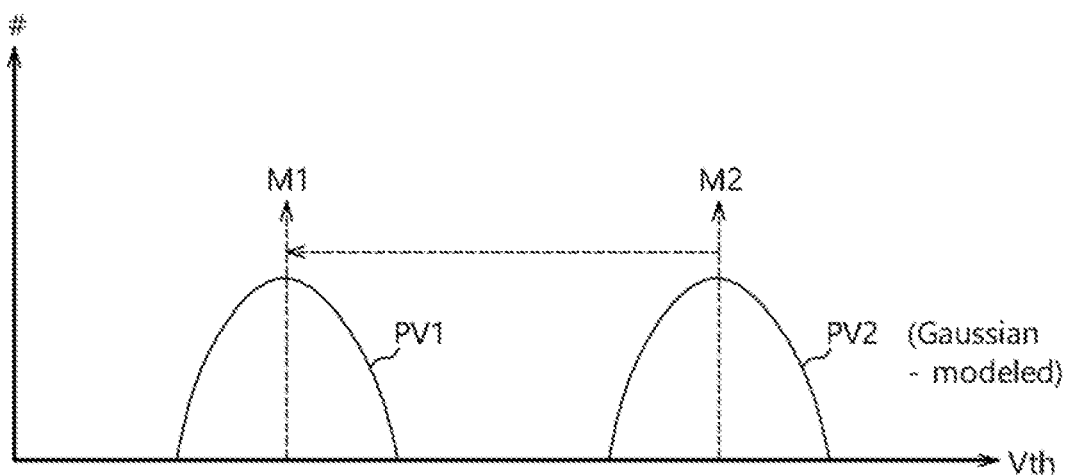
FIG. 12 is a diagram illustrating another method for estimating an average threshold voltage of a threshold voltage distribution.

FIG. 12 illustrates another method for the controller 100 of FIG. 1 for estimating an average threshold voltage M1 of a threshold voltage distribution PV1.

Referring to FIG. 12, the controller 100 may calculate the average threshold voltage M1 of the threshold voltage distribution PV1 which is not Gaussian-modeled, by adding or subtracting a predetermined offset value to or from an adjacent average threshold voltage M2 of an adjacent threshold voltage distribution PV2 which is Gaussian-modeled. In this case, the predetermined offset value may be set based on the widths of the threshold voltage distributions PV1 and PV2 and the interval between the threshold voltage distributions PV1 and PV2.

Figure 13:
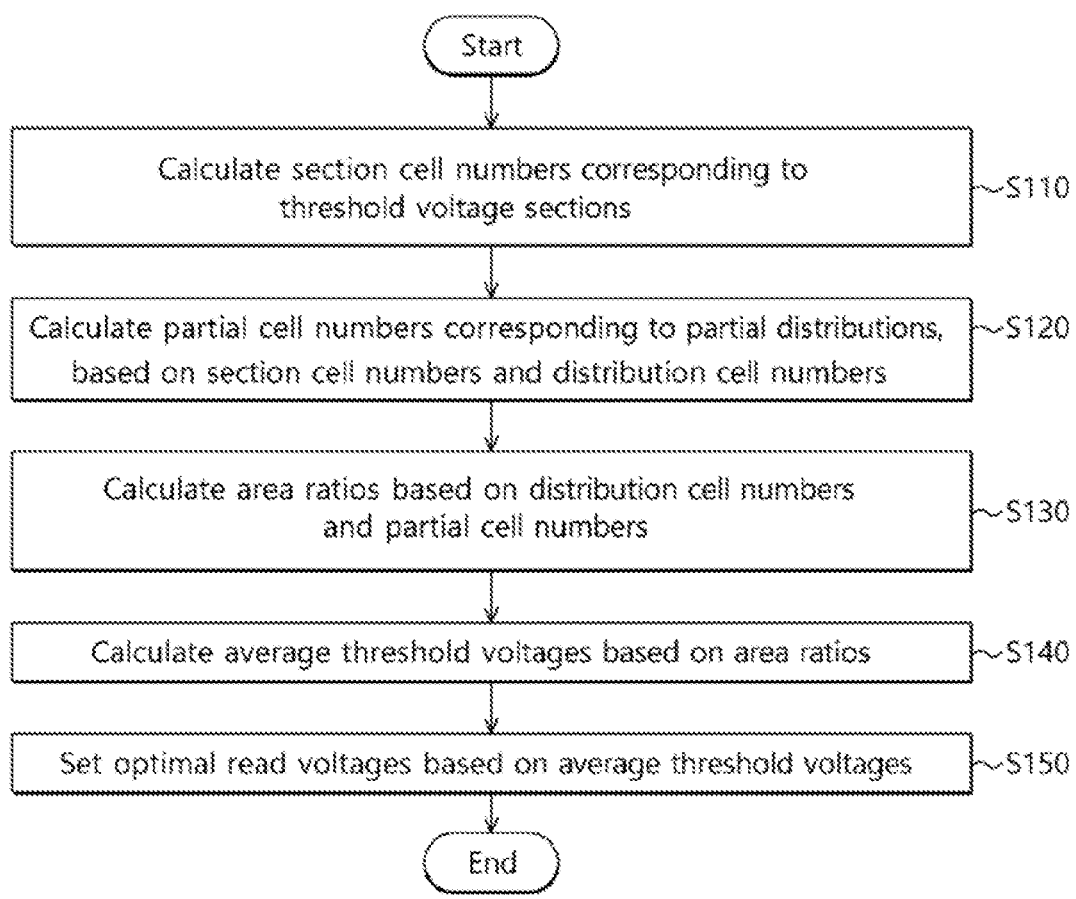
FIG. 13 is a flow chart of a method for estimating optimal read voltages, according to an embodiment of the invention.

Referring now to FIG. 13, a flow chart of a method for estimating optimal read voltages is provided. The method may be performed by the storage device 10 of FIG. 1. The controller 100 of the data storage device 10 may estimate the optimal read voltages. Accordingly, at step S110, the controller 100 may calculate section cell numbers corresponding to a plurality of threshold voltage sections divided by a plurality of reference voltages, based on data read from memory cells by applying the reference voltages to the memory cells.

At step S120, the controller 100 may calculate partial cell numbers corresponding to partial distributions formed as selected threshold voltage distributions are divided by the reference voltages, based on the section cell numbers and distribution cell numbers corresponding to threshold voltage distributions of the memory cells.

At step S130, the controller 100 may calculate area ratios of the partial distributions, based on the distribution cell numbers and the partial cell numbers corresponding to the selected threshold voltage distributions (See FIGS. 4 and 5).

At step S140, the controller 100 may calculate average threshold voltages of the selected threshold voltage distributions, based on the area ratios and a predetermined variance value (See Equation 7). For example, the controller 100 may calculate the average threshold voltages by applying the area ratios to an integral equation for a Gaussian distribution function. According to an embodiment, the controller 100 may calculate the average threshold voltages by referring to a table including values of the reverse function of a Q function, corresponding to the area ratios.

At step S150, the controller 100 may estimate optimal read voltages for reading data stored in the memory cells (See FIGS. 6A and 6B). The optimal read voltages may include middle values of adjacent average threshold voltages among the average threshold voltages. According to an embodiment, the optimal read voltages may include values obtained by adding or subtracting a predetermined offset value to or from the average threshold voltages.

Figure 14:
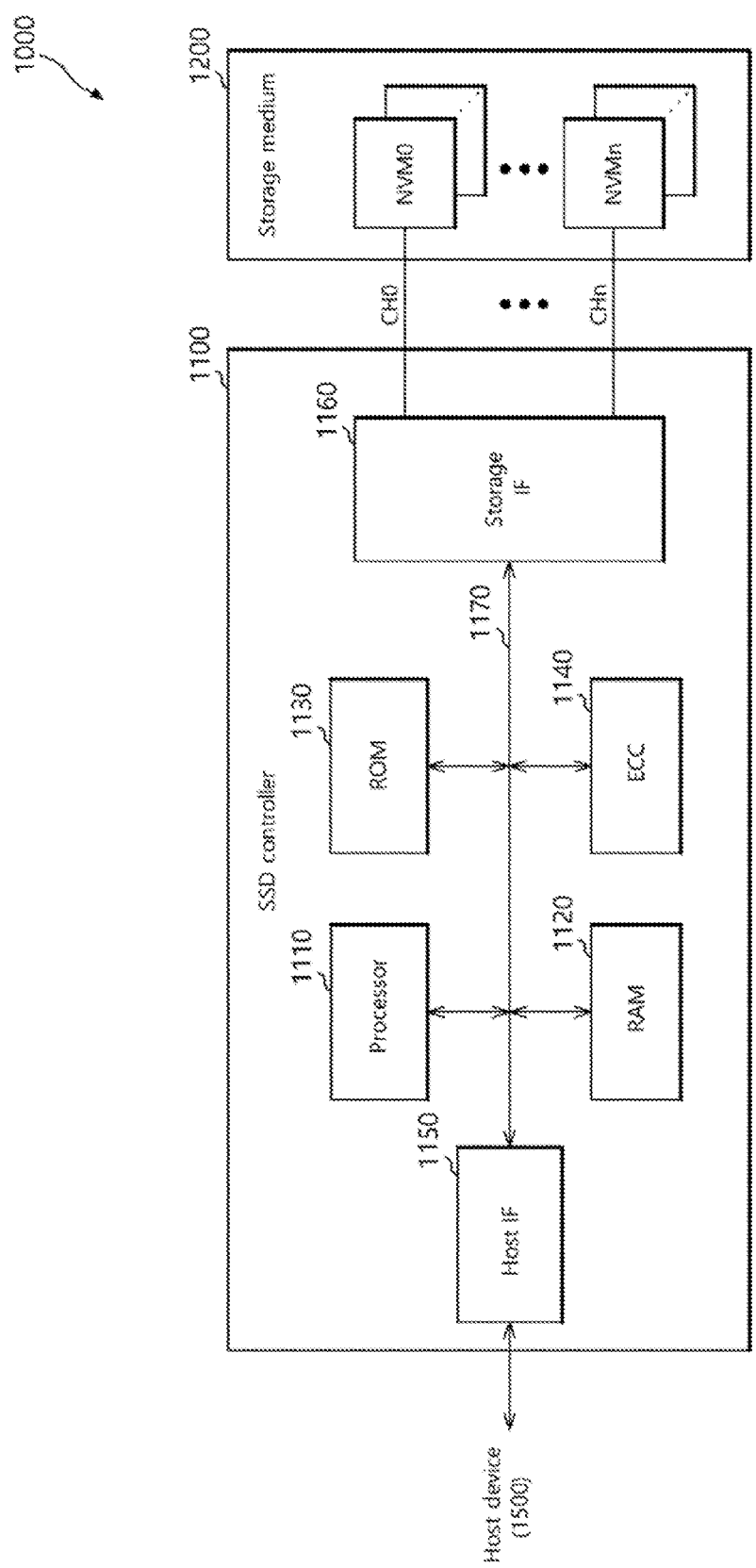
FIG. 14 is a block diagram illustrating a solid state drive (SSD), according to an embodiment of the invention.

Referring now to FIG. 14 a solid state drive (SSD) 1000 is provided, according to an embodiment of the invention.

Accordingly, the SSD 1000 may include a controller 1100 and a storage medium 1200. The controller 1100 may control data exchange between the host device 1500 and the storage medium 1200.

The controller 1100 may operate in a manner substantially similar to the controller 100 shown in FIG. 1. The controller 1100 may estimate average threshold voltages of threshold voltage distributions of memory cells through a GM operation, and estimate optimal read voltages based on the estimated average threshold voltages The controller 1100 may include a processor 1110, random access memory (RAM 1120, a read only memory (ROM) 1130, an error correction code (ECC) unit 1140, a host interface 1150, and a storage medium interface 1160, which are coupled to each other through a bus 1170.

The processor 1110 may control the general operations of the controller 1100. The processor 1110 may store data in the storage medium 1200 and read stored data from the storage medium 1200, according to data processing requests from the host device 1500. In order to efficiently manage the storage medium 1200, the processor 1110 may control the internal operations of the SSD 1000, such as a merge operation, a wear leveling operation, and the like.

The RAM 1120 may store programs and program data to be used by the processor 1110. The RAM 1120 may temporarily store data transmitted from the host interface 1150 before transferring it to the storage medium 1200, and may temporarily store data transmitted from the storage medium 1200 before transferring it to the host device 1500.

The ROM 1130 may store program codes to be read by the processor 1110. The program codes may include commands to be processed by the processor 1110 for the processor 1110 to control the internal units of the controller 1100.

The ECC unit 1140 may encode data to be stored in the storage medium 1200, and may decode data read from the storage medium 1200. The ECC unit 1140 may detect and correct an error occurred in data, according to an ECC algorithm.

The host interface 1150 may exchange data processing requests, data, etc. with the host device 1500.

The storage medium interface 1160 may transmit control signals and data to the storage medium 1200. The storage medium interface 1160 may be transmitted with data from the storage medium 1200. The storage medium interface 1160 may be coupled with the storage medium 1200 through a plurality of channels CH0 to CHn.

The storage medium 1200 may include plurality of non-volatile memory devices NVM0 to NVMn. Each of the plurality of nonvolatile memory devices NVM0 to NVMn may perform an operation, such as a write or read operation according to the control of the controller 1100.

Figure 15:
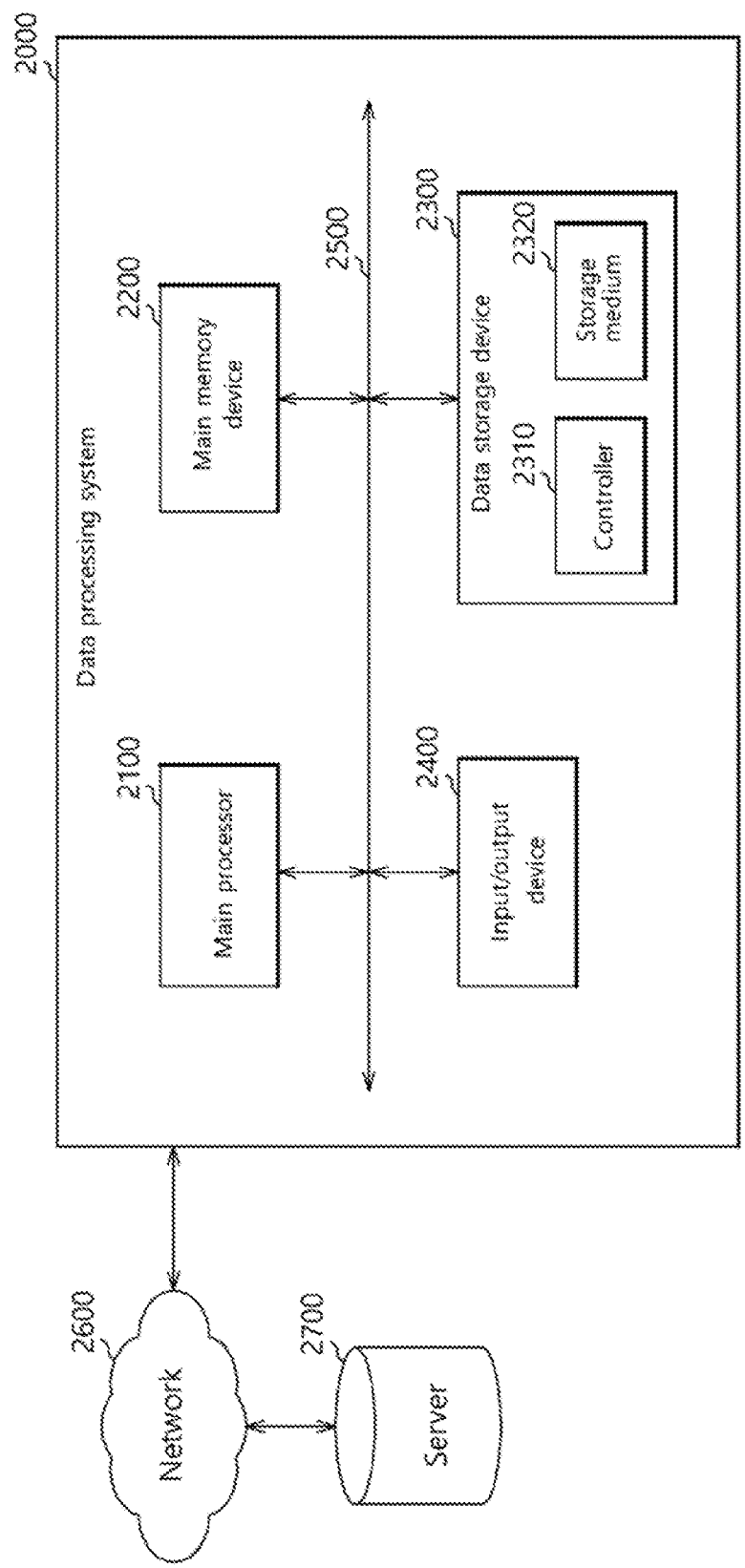
FIG. 15 is a block diagram illustrating a data processing system, according to an embodiment of the invention.

FIG. 15 illustrates a data processing system 2000 comprising a data storage device, according to an embodiment of the invention.

Referring to FIG. 15, the data processing system 2000 may include a computer, a laptop, a netbook, a smart phone, a digital TV, a digital camera, a navigator, etc. The data processing system 2000 may include a main processor 2100, a main memory device 2200, a data storage device 2300, and an input/output device 2400. The internal units of the data processing system 2000 may exchange data, control signals, etc. through a system bus 2500.

The main processor 2100 may control general operations of the data processing system 2000. The main processor 2100 may be, for example, a central processing unit, such as a microprocessor. The main processor 2100 may execute the software of an operation system, an application, a device driver, and so forth, on the main memory device 2200.

The main memory device 2200 may store programs and program data to be used by the main processor 2100. The main men device 2200 may temporarily store data to be transmitted to the data storage device 2300 and the input/output device 2400.

The data storage device 2300 may include a controller 2310 and a storage medium 2320. The data storage device 2300 may be configured and operate in a manner substantially similar to the data storage device 10 shown in FIG. 1.

The input/output device 2400 may include a keyboard, a scanner, a touch screen, a screen monitor, a printer, a mouse, or the like, capable of exchanging data with a user, such as receiving a command for controlling the data processing system 2000 from the user or providing a processed result to the user.

According to an embodiment, the data processing system 2000 may communicate with at least one server 2700 through a network 2600 such as a local area network (LAN), a WAN (wide area network (WAN), a wireless network, and so on. The data processing system 2000 may include a network into (not shoe to access ace the network 2600.

While various embodiments have been described above, it will be understood to those skilled in the art that the embodiments described are examples only. Accordingly, the data storage device and the operating method thereof described herein should not be limited based on the described embodiments. Many other embodiments and variations thereof may be envisaged by those skilled in the relevant art without departing from the spirit and or scope of the invention as defined by the following claims.

What is claimed is:

1. A data storage device comprising:
   a memory device including a plurality of memory cells; and
   a controller suitable for determining, based on data read from the plurality of memory cells, section cell numbers corresponding to threshold voltage sections, and for determining an average threshold voltage of a threshold voltage distribution selected among a plurality of threshold voltage distributions of the memory cells which are estimated based on the section cell numbers, based on a Gaussian distribution function.

2. The data storage device according to claim 1, wherein the controller is suitable for determining the section cell numbers corresponding to the threshold voltage sections based on the data read from the plurality of memory cells by applying at least one reference voltage to the memory cells, wherein the threshold voltage sections are divided by the reference voltage.

3. The data storage device according to claim 2,
   wherein the controller counts the number of memory cells corresponding to respective patterns of the data, as the section cell numbers, and
   wherein the patterns correspond to the threshold voltage sections.

4. The data storage device according to claim 2, wherein the controller determines an area ratio of a partial distribution which is formed as the selected threshold voltage distribution is divided by the reference voltage, based on the section cell numbers, and determines the average threshold voltage, based on the area ratio and a predetermined variance value corresponding to the selected threshold voltage distribution.

5. The data storage device according to claim 4, wherein the controller determines a partial cell number corresponding to the partial distribution, based on the section cell numbers and distribution cell numbers corresponding to the threshold voltage distributions, and determines the area ratio, based on a ratio of the partial cell number with respect to a distribution cell number corresponding to the selected threshold voltage distribution.

6. The data storage device according to claim 4, wherein the controller determines the average threshold voltage by applying the area ratio to an integral equation for the Gaussian distribution function.

7. The data storage device according to claim 4, wherein the controller determines the average threshold voltage by referring to a table which includes values of a reverse function of a Q function, the values including a value corresponding to the area ratio.

8. The data storage device according to claim 2, wherein the controller determines whether to adjust the reference voltage, based on the section cell numbers, set a new reference voltage by adjusting the reference voltage according to a determination result, and iterates determining of section cell numbers based on the new reference voltage.

9. The data storage device according to claim 8, wherein the controller determines whether the reference voltage is positioned in a reliable section excluding a lower unreliable section and an upper unreliable section in the selected threshold voltage distribution, based on the section cell numbers, and determines to adjust the reference voltage, in the case where the reference voltage is not positioned in the reliable section.

10. The data storage device according to claim 9, wherein the controller determines a cumulative cell number which is the number of memory cells having threshold voltages smaller than the reference voltage, based on the section cell numbers, and determines whether the reference voltage is positioned in the reliable section, by determining whether the cumulative cell number is included in a predetermined range with respect to a predetermined reference cell number.

11. The data storage device according to claim 9, wherein the controller determines an area ratio of a partial distribution which is formed as the selected threshold voltage distribution is divided by the reference voltage, based on the section cell numbers, and determines whether the reference voltage is positioned in the reliable section, by comparing the area ratio and area ratios of the lower unreliable section and the upper unreliable section.

12. The data storage device according to claim 9, wherein each of the lower unreliable section and the upper unreliable section has an area ratio larger than a cumulative error rate corresponding to the selected threshold voltage distribution.

13. The data storage device according to claim 8, wherein the controller sets an average threshold voltage of a selected threshold voltage distribution corresponding to the reference voltage, as the new reference voltage.

14. The data storage device according to claim 8, wherein, when the reference voltage is positioned in any one of a lower unreliable section and an upper unreliable section of a corresponding selected threshold voltage distribution, the controller acquires another reference voltage which is positioned in the other of the lower unreliable section and the upper unreliable section, and sets a middle value of the reference voltage and the another reference voltage, as the new reference voltage.

15. The data storage device according to claim 8, wherein, when another reference voltage adjacent to the reference voltage is positioned in a reliable section of another threshold voltage distribution adjacent to the selected threshold voltage distribution corresponding to the reference voltage, the controller sets the new reference voltage by adjusting, using a predetermined offset value, the another reference voltage.

16. The data storage device according to claim 1, wherein the controller is further suitable for estimating one or more optimal read voltages for reading data stored in the memory cells, based on the average threshold voltages.

17. The data storage device according to claim 16, wherein the optimal read voltages include a middle value of adjacent average threshold voltages among the average threshold voltages.

18. The data storage device according to claim 16, wherein the optimal read voltages include a value obtained by adding or subtracting a predetermined offset value to or from at least one among the average threshold voltages.

19. A method for operating a data storage device, comprising:
   determining, based on data read from a plurality of memory cells, section cell numbers corresponding to threshold voltage sections which are divided by at least one reference voltage; and
   determining an average threshold voltage of a threshold voltage distribution selected among a plurality of threshold voltage distributions of the memory cells which are estimated based on the section cell numbers, based on a Gaussian distribution function.

20. A data storage device comprising:
   a memory device including a plurality of memory cells; and
   a controller suitable for determining average threshold voltages of threshold voltage distributions selected among a plurality of threshold voltage distributions of the memory cells, by applying area ratios of partial distributions of the selected threshold voltage distributions to Gaussian modeling, and estimating one or more optimal read voltages for reading data stored in the memory cells, based on the average threshold voltages.

* * * * *